United States Patent

Collins

[11] Patent Number: 5,981,057
[45] Date of Patent: Nov. 9, 1999

[54] DIAMOND

[76] Inventor: John Lloyd Collins, 18 Rutland Park Gardens, Willesden Green, London, United Kingdom

[21] Appl. No.: 08/899,602

[22] Filed: Jul. 24, 1997

[30] Foreign Application Priority Data

Jul. 31, 1996 [GB] United Kingdom .................. 9616043

[51] Int. Cl.[6] .................................................. C23C 16/00
[52] U.S. Cl. .......................... 428/334; 51/295; 51/307; 51/309; 407/119; 427/249; 428/408; 428/698
[58] Field of Search .................................. 428/408, 704, 428/334, 698; 423/446; 51/307, 309; 407/119; 427/249

[56] References Cited

U.S. PATENT DOCUMENTS

| | | | |
|---|---|---|---|
| 4,490,015 | 12/1984 | Kobashi et al. | |
| 4,961,958 | 10/1990 | Desphandey et al. | 423/446 |
| 5,133,332 | 7/1992 | Zanaker et al. | 125/39 |
| 5,234,724 | 8/1993 | Schmidt | 423/446 |
| 5,270,028 | 12/1993 | Tanabe et al. | 423/446 |
| 5,270,029 | 12/1993 | Yamazaki | 423/446 |
| 5,353,737 | 10/1994 | Koyama et al. | 117/90 |
| 5,445,851 | 8/1995 | Hirabayashi et al. | 423/446 |
| 5,474,816 | 12/1995 | Falabella | 423/446 |
| 5,591,481 | 1/1997 | Poncelet et al. | 427/249 |
| 5,635,258 | 6/1997 | Chen et al. | 427/249 |
| 5,648,139 | 7/1997 | Sussmann et al. | 428/408 |
| 5,747,118 | 5/1998 | Bunshah et al. | 427/577 |

FOREIGN PATENT DOCUMENTS

| | | |
|---|---|---|
| 0320657 | 6/1989 | European Pat. Off. |
| 0 487 292 | 5/1992 | European Pat. Off. |
| 0 567 124 A3 | 10/1993 | European Pat. Off. |

OTHER PUBLICATIONS

Zhang et al "Boron Doping of Diamond Films by $B_2O_3$ Vaporization" phys. stal. sol (3) 133, 377 c1992.

Okuno et al "Characterization of Boron–Doped Diamond Film" vol. 28 No. 6, Jun. 1989, 1066–1071.

Tsai et al "Diamond MESFET Using UltraShallow RTP Boron Doping" IEE Electron Device Letters, vol. 12, No. 4 Apr. 1991.

Abstract of JP 3–142104 Jun. 1991.

Database WPI, Derwent Publications, AN 86–335590, JP 61–251158, Nov. 8, 1986.

Meisser, et al., Materials Research Society, Pennsylvania US XP002046832, pp. 770–772, Sep. 27, 1990, "Proceedings Of The Second International Conference, New Diamond Science And Technology".

Fangqing Zhang, et al., Materials Letters, vol. 19, No. 3–4, pp. 115–118, Apr. 1994, "Synthesis And Infrared Absorption Characteristics Of Boron–Doped Semiconducting Diamond Thin Films".

*Primary Examiner*—Archene Turner
*Attorney, Agent, or Firm*—Oblon, Spivak, McClelland, Maier & Neustadt, P.C.

[57] ABSTRACT

A CVD diamond layer for use as an insert in an abrasive tool characterized by the following features:

(i) the layer contains boron dopant atoms in a concentration of at least 0.05 atomic percent;

(ii) an average tensile rupture strength of at least 600 MPa with the nucleation phase in tension, and at least 300 MPa with the growth face in tension, both such tensile rupture strengths being measured by a three point bend test on a sample 18 mm long, 2 mm wide and a thickness of 1.4 mm or smaller.

20 Claims, 1 Drawing Sheet

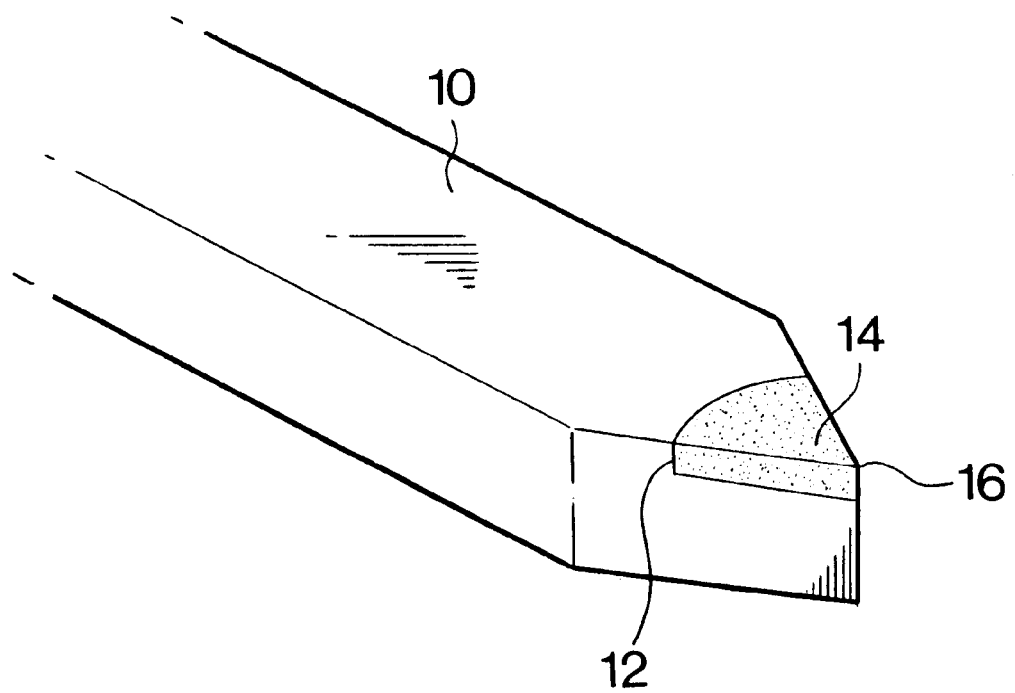

DIAMOND

BACKGROUND OF THE INVENTION

This invention relates to diamond, and more particularly to diamond produced by chemical vapour deposition (hereinafter referred to as "CVD"), which is suitable for use as an insert for abrasive tools.

Methods of depositing material such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F,Cl) in atomic form and C or carbon containing radicals and other reactive species, e.g. $CH_x$, $CF_x$ wherein x can be 1 to 4. In addition oxygen containing sources may be present, as may sources for nitrogen, and for boron. In many processes inert gases such as helium, neon or argon are also present. Thus, a typical source gas mixture will contain hydrocarbons $C_xY_y$, wherein x and y can each be 1 to 10, halocarbons $C_xY_yHal_z$ (e.g. $CF_4$), or $CO_x$, wherein x can be 1 to 3 and optionally one or more of the following: $O_2$, $H_2$, $N_2$, $NH_3$, $B_2H_6$, and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, lasers, RF energy, a flame, or a hot filament, and the reactive gas species so produced are allowed to deposit onto a substrate and form diamond.

Layers of CVD diamond have been proposed as inserts for abrasive tools, particularly cutting tools. CVD diamond layers have found limited commercial favour for such applications. One of the reasons for this is that CVD diamond layers have poor electrical conductivity making them difficult to cut and shape into a desired form for cutting insert using conventional EDM techniques. It has been proposed to introduce boron dopant atoms into CVD diamond layers to improve the electrical conductivity, but this has led to a deterioration in the strength of the layer.

SUMMARY OF THE INVENTION

According to the present invention, a CVD diamond layer for use as an insert in an abrasive tool is characterised by the following features:

(i) the layer contains boron dopant atoms in a concentration of at least 0.05 atomic percent, substantially all the boron dopant atoms preferably being in substitutional positions within the crystal lattice;

(ii) an average tensile rupture strength of at least 600 MPa with the nucleation face in tension, and at least 300 MPa with the growth face in tension, both such tensile rupture strengths being measured by a three point bend test on a sample 18 mm long, 2 mm wide and a thickness of 1.4 mm or smaller; and, preferably, (iii) an electric discharge machine (EDM) cutting rate of at least 1 mm $min^{-1}$.

BRIEF DESCRIPTION OF THE DRAWING

The drawing illustrates a perspective view of an embodiment of a cutting tool using a CVD diamond layer of the invention.

DESCRIPTION OF EMBODIMENTS

The boron dopant atoms in the CVD diamond layer will typically be present in an amount of 0.05 to 0.5 atomic percent, and preferably 0.1 to 0.3 atomic percent. Substantially all of the boron dopant atoms are preferably in substitutional positions, although some of the boron dopant atoms will be present at grain boundaries. At least 80 percent, and preferably at least 90 percent, of the boron dopant atoms may be in substitutional positions within the crystal lattice of the diamond layer. The high EDM cutting rates achievable are evidence of this.

It is preferred that the boron dopant atoms are uniformly dispersed throughout the layer. The uniformity is such that the concentration of dopant atoms in any volume of 1 $mm^3$ within the layer will not vary from the concentration of any other volume of 1 mm3 by more than 5 to 10 percent.

The CVD diamond layer is also characterised by a high strength. This strength is measured by the tensile rupture strength which will vary according to whether it is the nucleation face, i.e. the region in which diamond nucleation occurred, or the growth face, i.e. the face on which growth of the diamond on the nucleation region occurred.

The thickness of the layer will vary according to the nature of the application to which it is to be put. Typically the layer will have a thickness of 0.1 to 3.0 mm.

The CVD diamond layer will preferably be fine grain, for example, having an average particle size of less than 100 microns, and typically less than 50 microns.

The CVD diamond layer may be single crystal, but is preferably polycrystalline.

The layer may be unbacked or backed by a suitable carbide-forming metal or cemented carbide. Typically such a metal is of the transition metal group and such a carbide is tungsten carbide, tantalum carbide, titanium carbide or molybdenum carbide. The layer will generally be bonded to the backing, when provided.

Further according to the invention, an abrasive tool comprises a support having mounted thereon a CVD diamond layer as described above, which presents a cutting edge for the tool. The tool may be a cutting, turning or milling tool or drill bit. The mounting of the CVD layer on the support may be by brazing or other method.

The CVD diamond layer of the invention has particular application in the cutting and turning of non-ferrous materials, plastics, wood, metal matrix composites (MMC's) and in rock drilling.

An example of a cutting tool utilising a CVD diamond layer of the invention is illustrated by FIG. 1. Referring to this figure, the cutting tool comprises a support or shank 10 having a recess 12 at one end thereof. Located in the recess, and bonded to the support, is a CVD diamond layer 14. This layer presents a cutting point 16.

In this embodiment, an unbacked CVD diamond layer is illustrated. The layer may also be a backed layer in which event the backing will be sandwiched between the CVD diamond layer 14 and the support 12 of the tool.

The CVD diamond layer of the invention may be made using known conditions of CVD diamond growth utilising, as the energy source for dissociating the carbon-containing gas, methods such as high microwave plasma deposition, low frequency microwave plasma deposition, hot filament, DC arc jet, plasma jet or the like. In such methods, and in order to produce a CVD diamond layer having the desired characteristics, the following general conditions should prevail:

(i) The diamond growth takes place in the presence of an atmosphere containing substantially no nitrogen or oxygen, i.e. less than 2 parts per million. Thus, only high purity gases should be used. The incoming nitrogen level and oxygen level of the gases used should be less than 1 part per million. The remaining nitrogen or oxygen present relates to the outgassing phenomenon which occurs under plasma excitation;

(ii) Sources of boron dopant should be substantially free of unwanted sources of residuals such as oxygen and nitrogen and are preferably compounds containing boron and hydrogen or carbon. An example of such a compound is diborane ($B_2H_6$). The dopant can be pure boron metal vaporised or heated in situ to release suitable quantities of boron dopant into the reaction gases; and (iii) In the case of microwave power CVD, high microwave powers, e.g. 3–30 KW, and high gas pressures, e.g. 50–470×$10^2$Pa, and preferably 100–350×10 $^2$Pa, are used creating a high plasma power density.

The invention will now be illustrated by way of the following examples.

EXAMPLE 1

In this example, microwave plasma CVD synthesis reactor (which is well known in the CVD art) was used as the principal deposition apparatus. Layers of up to about 2 mm thick of boron-doped CVD diamond were deposited on to a variety of substrates.

The layers of CVD diamond were deposited on to carbide-forming substrates which, in this example, were engineering grade tungsten. The substrates used typically had a surface roughness ($R_a$) of between 4 and 8 $\mu$m. These substrates were all cleaned in various grease-dissolving solvents and washed in deionised water prior to being baked in an oven at 120° C. for 1–2 hours. The substrates were not abraded with diamond—or any other powder, i.e. they are not seeded in any way prior to CVD diamond deposition.

The substrate was loaded into the microwave plasma CVD diamond deposition reactor and a pump-purge operation, using $H_2$/Ar as the purge gas, was completed over a period of 2 hours, resulting in an ultimate base pressure of the system of less than 2×$10^{-5}$ mbar, with a zero leak-up rate over 10 minutes.

A mix of $H_2$/Ar was introduced into the reaction chamber in the ratio $H_2$/Ar at 1600:50 sccm and held at a pressure of 5 mbar whilst the plasma was produced. The gas pressure was then increased to its ultimate synthesis pressure of 270 mbar as the microwave input power to the system was correspondingly increased, maintaining a plasma which spread over the whole surface of the substrate.

The substrate was heated by the microwave plasma was heated whilst the pressure was held at 270 mbar until it reached a temperature of about 900° C.

Once at temperature, $CH_4$ was introduced in the ratio $H_2$/$CH_4$ at 1600:40 sccm. The methane level can be lower than 40 sccm although no improvement to the properties or performance was found compared with the reduction in CVD diamond growth rate.

After an initial deposition period of 30 minutes of undoped CVD diamond, 0.05% diborane ($B_2H_6$) gas diluted in pure $H_2$ was introduced into the gas mix in the ratio $H_2$/Ar/$CH_4$/$B_2H_6$-$H_2$ as 1600:50:40:25 sccm. The reaction gas pressure was maintained at 270 mbar, the substrate temperature at 950° C. and the microwave power at 4 kW throughout the deposition run.

The deposition run was terminated by first switching-out the $B_2H_6$-$H_2$, followed by switching-out the $CH_4$ and then the reverse process to start-up was followed, reducing the substrate temperature to below 450° C. over about a 10 minute period.

Diborane gas was used because it decomposes to the boron dopant and hydrogen residual comparatively easily. The activated boron in the plasma is readily incorporated into the CVD diamond if growth is maintained under these conditions. Examples of other useful boron dopant sources are trimethyl boron and elemental boron, using a hot filament of boron metal, to produce the necessary gaseous or elemental boron atoms. However, other dopant sources which are not readily decomposed or contain unwanted residuals (such as oxygen or nitrogen) do not produce B-doped CVD diamond which is as suitable for aggressive mechanical applications (such as cutting, milling or turning of metals, wood, MMC's etc) since the introduction of these unwanted residuals reduces the quality of the CVD diamond. Boron doped CVD diamond layers using high levels of diborane in the gas phase (and using other B-containing dopants) with corresponding high levels of boron in the CVD diamond layer have not been reported as being grown with the consistency of material properties or with high material mechanical strength and mechanical applications performance required to make a usable cutting tool or other mechanical application product.

The growth rate found at the end of a 138 hour synthesis run was about 7.4 $\mu$m hour$^{-1}$, corresponding to a layer thickness of 1.02 mm. Subsequent analysis of the layer showed it to have a <110> preferred orientation of well-intergrown, clean crystals which appeared to be an evenly distributed mix of (100), (110) and (111) facets, each about the same size with a nominal grain size of 50–100. The layer was well-adhered to the tungsten substrate, showing no signs of delamination or cracking.

Examination of the growth surface by SEM showed no preponderance of exposed grain boundaries or other gross defects in the layer. Chemical analysis by EDX using the SEM facility showed no material to be present (at less than 0.1% levels) other than C since B is not easily detected using this apparatus.

Chemical analysis of the boron content of the layer was made by SIMS using a Cameca 3f SIMS system which showed there to be a variation in the boron concentration across the disc of a factor of twice as much boron at the edge of the disc compared with that at the centre, at 0.16% atomic at the centre and 0.3% atomic at the outer edge of the disc. This could be due to a slight temperature difference between centre and edge of the disc resulting in better incorporation of the boron into the diamond at the edge than the centre.

This variation in boron incorporation is reflected in the electrical resistivity of the layer, measured using 4-point probe technique at 3.7 Ohm-cm at the centre of the disc (corresponding to a measured B-incorporation of 1.7× $10^{20}$cc$^{-1}$) with an EDM cutting rate (using a Sondick EDM machine) of 2.2 mm min$^{-1}$ compared with 1.6 Ohm-cm at the edge of the disc (corresponding to a measured B-incorporation of 3.8×$10^{20}$cc$^{-1}$) with an EDM cutting rate (using a Sondick EDM machine) of 3.9 mm min$^{-1}$. The high EDM cutting rates indicate that at least 80 percent of the boron was in substitutional positions.

The layer was cut whilst still strongly adhered to the tungsten substrate at the rates described above. The layer was also removed from the substrate by chemical etching of the tungsten and subsequently cut into test pieces to determine the mechanical properties of the material and its uniformity across the disc and its mechanical performance in turning and milling applications.

The EDM cutting rate was unaffected by removal from the tungsten substrate and remained at between 2.2 and 3.9 mm min$^{-1}$.

The mechanical strength across the disc appeared unaffected by the high level of boron incorporation, with a growth surface strength of typically 550–600 MPa and a nucleation surface strength of 1050–1100 MPa (both ±50 MPa). These strengths were tensile rupture strengths measured by a three point bend test on a sample 18 mm long and 2 mm wide.

In turning applications the B-doped CVD diamond has been shown to have a lower wear rate when turning MMC's and 18% Si—Al than commercially available PCD (polycrystalline diamond) products used in the same application with a corresponding high quality workpiece surface finish.

EXAMPLE 2

A CVD diamond layer was produced using conditions similar to that set out in Example 1, save that the substrate remained negatively biased at a bias voltage of typically −200V to −400V, with a typical bias current of 0.5 to 1 mA. The bias had no effect on the plasma, but was found to reduce the grain size of the CVD diamond layer to between 10 and 30 microns throughout the layer. This fine grain size makes the layer ideally suitable for controlled mechanical breakdown applications such as in turning, milling and grinding. Further, the CVD diamond layer was found to have a uniformity of boron dopant atom dispersion through the layer such that the concentration of dopant atoms in any volume of 1 mm$^3$ within the layer did not vary from a concentration of any other volume of 1 mm$^3$ by more than 5 to 10 percent.

Similar growth conditions can be applied to other CVD diamond growth techniques such as plasma jet, hot filament, DC arc and the like.

EXAMPLE 3

In edge milling field trials, cutting laminated oxide coated flooring (marketed for high wear resistance and minimum maintenance) using boron-doped CVD diamond produced by the method described in Example 1, outperformed undoped CVD diamond by cutting six times the length of flooring board directly. The initial tool flank wear per meter of cut was also substantially lower at 0.02 mm m$^{-1}$ compared with 0.034 mm m$^{-1}$ for the undoped tool with equivalent edge cut quality suggesting far higher abrasion resistance of the boron doped CVD diamond and much improved tool lifetimes are possible as a result.

The laminate comprised of four different layers: a protective alumina impregnated paper top layer (in various weights between 25 and 62 gm$^{-2}$) to give it wear resistance (it's abrasion resistance monitored against the industry standard Taber test); a decorative layer which was impregnated with Melamine; a thick (8–15 mm) moisture resistant MDF (medium density fibre board) and a melamine underlay to ensure panel flatness. All four layers were glued, pressed and high-temperature bonded (at ~210° C.) into boards approximately 2.5×2 mm ready to be cut and profiled.

After cutting to size the panels were edge milled using a Homag edge milling machine used to mill a tongue and groove profile onto the boards. The cutter used was that for fine-finishing where edge quality of the finished board is paramount and assessed by the operator at regular intervals of board cut length to determine if the tool should be withdrawn from service because of poor board edge quality. The cutting tool parameters were set as:

| | |
|---|---|
| Blade diameter | 200 mm |
| Knives | 8 |
| Clearance | 17° |
| Flank angle | 10° |
| Rake angle | −0.5° to −1° |
| Wedge angle | 78° |
| Shear angle | 15° |
| Cutting mode | Upwards |

In these applications the quality of tool performance is evaluated indirectly, in terms of operator assessment of the size and number of acceptable chips on the mating-edge of the cut boards.

A standard edge milling operation was used in the trials where 8-toothed blades using boron doped and undoped diamond were tested head-to-head, using the following cutting parameters:

| | |
|---|---|
| Blade speed | 6000 rpm |
| Peripheral speed | 62.83 msec$^{-1}$ |
| Feed rate | 53 m min$^{-1}$ |
| Feed per tooth | 1.10 mm per tooth |

The average of four trials made to produce saleable laminated flooring product gave the following data showing the substantial increase in boron-doped diamond lifetime compared with that for undoped diamond and conventional polycrystalline diamond (PCD) knife blades:

| Material for knife blades | Trial 1 Cut length (linear m) | Trial 2 Cut length (linear m) | Trial 3 Cut length (linear m) | Trial 4 Cut length (linear m) | Average Cut length (linear m) |
|---|---|---|---|---|---|
| Undoped CVD diamond | 3936 | 3528 | 3015 | 3705 | 3546 |
| PCD | 10680 | 10332 | 10050 | 9350 | 10103 |
| B-doped CVD diamond | 26208 | 16302 | 28020 | 14820 | 21337 |

The initial tool flank wear per meter of cut was also substantially lower at 0.02 mm m$^{-1}$ compared with 0.034 mm m$^{-1}$ for the undoped diamond with equivalent edge cut quality suggesting far higher abrasion resistance of the B-doped diamond and much improved tool lifetimes are possible as a result.

EXAMPLE 4

In thermogravimetric analysis of boron-doped CVD diamond produced by the method described in Example 1, the oxidation resistance of the boron-doped CVD diamond was found to be considerably greater than that of undoped CVD diamond prepared and analysed in the same manner. The boron doped diamond was considerably more resistant to both the onset and complete progression of oxidation in a flowing oxygen stream compared with the undoped diamond.

Discs of boron-doped CVD diamond and undoped CVD diamond were synthesised to 0.8 mm thick and polished on the nucleation face (to remove ~1 mm) and growth face (to remove ~0.2 mm) to a final thickness of 0.5 mm thick. These were subsequently laser cut to produce 8.0×2.0×0.5 mm bars (~30 mg weight) for analysis to ensure uniform sample size tested and sample surface exposed during analysis. The doping level in the B-doped CVD diamond bars was assessed by SIMS using a Cameca 3f machine (and compared with a boron ion-implanted natural diamond plate) to be ~$5 \times 10^{20}$ cm$^{-3}$. The undoped CVD diamond was similarly analysed to ensure no B-dopant was detectable at the ~$10^{14}$ cm$^{-3}$ detection limit. Other contaminants were found to exist at similar (~$10^{16}$ cm$^{-3}$) levels in both types of CVD diamond.

The samples were analysed in a pure oxygen gas stream (at 73 sccm) using a DuPont 9900 TGA with a temperature ramp of 30° C. per minute to a maximum of 1150° C. The percentage weight loss of the materials was seen as a function of sample temperature (and thus temperature rise time) indicating the temperature at the onset and progression of oxidation occurred.

The boron doped CVD diamond was seen to begin oxidation at ~925° C. compared with ~775° C. for the undoped diamond. The boron doped CVD diamond completely oxidised at ~1150° C. compared with ~975° C. for the undoped CVD diamond. These results show a substantial oxidation resistance increase due to the boron doping.

I claim:

1. A CVD diamond layer characterized by the following features:
   (i) the layer contains boron dopant atoms in a concentration of at least 0.05 atomic percent;
   (ii) an average tensile rupture strength of at least 600 MPa with the nucleation face in tension, and at least 300 MPa with the growth face in tension, both such tensile rupture strengths being measured by a three point bend test on a sample 18 mm long, 2 mm wide and a thickness of 1.4 mm or smaller.

2. A CVD diamond layer according to claim 1 wherein the boron dopant atoms in the layer are present in an amount of 0.05 to 0.5 atomic percent.

3. A CVD diamond layer according to claim 1 wherein the boron dopant atoms in the layer are present in an amount of 0.1 to 0.3 atomic percent.

4. A CVD diamond layer according to claim 1 wherein substantially all the boron dopant atoms are in substitutional positions within the crystal lattice of the diamond layer.

5. A CVD diamond layer according to claim 1 wherein at least 80 percent of the boron dopant atoms are in substitutional positions within the crystal lattice of the diamond layer.

6. A CVD diamond layer according to claim 1 wherein at least 90 percent of the boron dopant atoms are in substitutional positions within the crystal lattice of the diamond layer.

7. A CVD diamond layer according to claim 1 wherein the boron dopant atoms are uniformly dispersed throughout the layer.

8. A CVD diamond layer according to claim 7 wherein the uniformity is such that the concentration of dopant atoms in any volume of 1 mm$^3$ within the layer does not vary from the concentration of any other volume of 1 mm$^3$ by more than 5 to 10 percent.

9. A CVD diamond layer according to claim 1 which has an electric discharge machine cutting rate of at least 1 mm min$^{-1}$.

10. A CVD diamond layer according to claim 1 which has a thickness of 0.1 to 3.0 mm.

11. A CVD diamond layer according to claim 1 which is single crystal diamond.

12. A CVD diamond layer according to claim 1 which is polycrystalline diamond.

13. A CVD diamond layer according to claim 1 which is fine grain.

14. A CVD diamond layer according to claim 13 which has an average particle size of less than 100 microns.

15. A CVD diamond layer according to claim 13 which has an average particle size of less than 50 microns.

16. A CVD diamond layer according to claim 1 which is bonded to a backing.

17. A CVD diamond layer according to claim 16 wherein the backing is selected from carbide-forming metals and cemented carbides.

18. An abrasive tool comprising a support having mounted thereon a CVD diamond layer according to claim 1 and which presents a cutting point or edge for the tool.

19. A method for preparing a CVD diamond layer according to claim 1, comprising plasma disassociating a carbon containing gas together with a boron containing material free of oxygen and nitrogen in an atmosphere substantially free of oxygen and nitrogen.

20. The method according to claim 19, wherein less than 2 parts per million oxygen and nitrogen are present in said atmosphere.

* * * * *

UNITED STATES PATENT AND TRADEMARK OFFICE
CERTIFICATE OF CORRECTION

PATENT NO. : 5,981,057
DATED : November 9, 1999
INVENTOR(S) : John Lloyd Collins It is certified that error appears in the above-identified patent and that said Letters Patent is hereby corrected as shown below:

Column 2,
Line 13, "1 mm3" should read -- 1 $mm^3$ --.

Column 6,
Line 64, "~ 1mm)" should read -- ~0.1mm) --.

Signed and Sealed this

Eighteenth Day of September, 2001

*Attest:*

Nicholas P. Godici

*Attesting Officer*

NICHOLAS P. GODICI
*Acting Director of the United States Patent and Trademark Office*